United States Patent [19]
Han et al.

[11] Patent Number: 5,926,235
[45] Date of Patent: Jul. 20, 1999

[54] ACTIVE MATRIX LIQUID CRYSTAL DISPLAY AND METHOD OF MAKING

[75] Inventors: Chang-Wook Han; Kyoung-Nam Lim, both of Seoul; Byung-Chul Ahn, Kyungsangbook-do; Jeong-Hyun Kim; Ki-Hyun Lyu, both of Kyunggi-do, all of Rep. of Korea

[73] Assignee: LG Electronics, Seoul, Rep. of Korea

[21] Appl. No.: 08/861,315

[22] Filed: May 21, 1997

[30] Foreign Application Priority Data

May 23, 1996 [KR] Rep. of Korea ............ 96-17813

[51] Int. Cl.$^6$ .............. G02F 1/136; G02F 1/1333; H01L 29/04
[52] U.S. Cl. .............. 349/43; 349/122; 349/138; 257/59; 257/72
[58] Field of Search ............ 257/59, 72; 349/43, 349/122, 138

[56] References Cited

U.S. PATENT DOCUMENTS 5,166,085  11/1992  Wakai et al. ................. 437/40
5,731,216  3/1998  Holmberg et al. ............ 437/40
5,737,041  4/1998  Holmberg et al. ............ 349/43

FOREIGN PATENT DOCUMENTS

A-6250210  9/1994  Japan.

Primary Examiner—William L. Sikes
Assistant Examiner—Joanne Kim

[57] ABSTRACT

An active matrix liquid crystal display (AMLCD) and method of manufacture includes gate bus lines and gate electrodes formed on a substrate; a gate insulating layer formed on the substrate, the gate bus lines and the gate electrodes; a semiconductor layer formed on the gate insulating layer; and an ohmic contact layer formed on the semiconductor layer. Also source bus lines, source electrodes, drain electrodes and storage electrodes of storage capacitors are formed on the ohmic contact layer. A first passivation layer covers the storage capacitors, the drain electrodes, the semiconductor layer, the source bus lines and source electrodes; and a second passivation layer covers the first passivation layer and the substrate. Contact holes formed in the first and second passivation layers expose the drain electrodes and the storage capacitors. Pixel electrodes are formed on the storage electrodes, the drain electrodes, the passivation layer, and the substrate.

18 Claims, 9 Drawing Sheets

5,926,235

ACTIVE MATRIX LIQUID CRYSTAL DISPLAY AND METHOD OF MAKING

BACKGROUND OF THE INVENTION

The present invention relates to a method for manufacturing an active matrix liquid crystal display ("AMLCD") comprising thin film transistors ("TFT"), and to a structure of the AMLCD manufactured by such a method.

In general as depicted in FIGS. 1 and 2, the AMLCD comprises a substrate ("first substrate") 3 on which a plurality of pixel electrodes 4 are arrayed in a matrix form. Each pixel electrode 4 on the first substrate 3 is bounded by two gate bus lines 17 and two source bus lines 15, each gate bus line 17 being perpendicular with each source bus line 15. The gate bus lines 17 are horizontally formed, and a plurality of gate electrodes 7 perpendicularly branch out from the gate bus lines 17. The source bus lines 15 are vertically formed, and a plurality of source electrodes 5 perpendicularly branch out from the source bus lines 15.

The TFTs are formed near the crossing points of the gate bus lines 17 and the source bus lines 15 and are electrically connected with the pixel electrodes 4. An alignment film (not depicted) which sets the original direction of liquid crystal is formed on the TFTs and the pixel electrodes 4.

The AMLCD also comprises another substrate ("second substrate") 2 on which a color filter layer (not depicted), common electrodes (not depicted) and an alignment film (not depicted) are formed. The first and second substrates 3 and 2 are joined facing each other, and liquid crystal is injected into the space between the alignment films of the first and second substrates 3 and 2. The first and second substrates 3 and 2 have polarizing films 1A and 1B on their outer sides. The AMLCD is manufactured by combining the above mentioned constituents.

Among the above mentioned constituents, the method for manufacturing a first substrate is described below with reference to the drawings.

As shown in FIG. 3A, a Cr layer is deposited on a transparent glass substrate 10. A photo-resist is coated on the Cr layer and the photo-resist is developed into a desired pattern by using a pre-fabricated mask. A gate bus line 17 and a gate electrode 7, which branches out from the gate bus line 17, are formed by etching a portion of the Cr layer along the developed pattern of the photo-resist (FIG. 3A). Afterward, a SiNx film (from which a gate insulating layer 9 is formed later), an amorphous silicon ("a-Si") film (from which a semiconductor layer 11 is formed later), and an $n^+$ a-Si film (from which an ohmic contact layer 12 is formed later).

Subsequently, a photo-resist is coated on the $n^+$ a-Si film and the photo-resist is developed into a desired pattern by using a mask. An ohmic contact layer 12 and the semiconductor layer 11 are formed by etching the $n^+$ a-Si film and the a-Si film at the same time along the developed pattern (FIG. 3C).

Then, Cr is deposited by sputtering on the gate insulating layer 9, the ohmic contact layer 12 and the semiconductor layer 11. A photo-resist is coated on the Cr layer and the photo-resist is developed into a desired pattern by using a mask. A source bus line 15 (functioning as a signal line), a source electrode 5 (which branches out from the source bus line 15) and a drain electrode 6 (functioning as an output electrode) are formed by etching the Cr layer along the developed pattern. The middle of the ohmic contact layer 12 is etched by using the source and drain electrodes as etching masks, so that the ohmic contact layer 12 is separated into two parts (FIG. 3D).

Thereafter, a passivation layer 13 is coated on the gate insulating layer 9, the source bus 15, the source terminal 5, the drain terminal 6, the ohmic contact layer 12 and the semiconductor layer 11. A photo-resist is coated on the passivation layer 13 and the photo-resist is developed into a desired pattern by using a mask. A contact hole 16 is formed in a portion of the passivation layer 13 on the drain electrode by etching the passivation layer 13 along the developed pattern (FIG. 3E).

An ITO (Indium Tin Oxide) layer is formed by sputtering onto the passivation layer 13 and the drain terminal 6 (at the contact hole). A photo-resist is coated on the ITO layer and the photo-resist is developed into a desired pattern by using a mask. A pixel electrode 4 is formed by etching the ITO layer along the developed pattern of the photo-resist (FIG. 3F).

As described above, in the conventional method for manufacturing the AMLCDs, the mask process needs to be used five times in order to manufacture the pixel electrode 4.

The mask process comprises the steps of depositing a film on a substrate and rinsing the surface of the film, coating a photo-resist on the rinsed surface of the film, exposing and developing the photo-resist by using a mask, etching the film along the developed pattern of the photo-resist and removing the photo-resist on the patterned film.

As described above, the mask process is not only complicated but also takes much time and results in relatively high rate of defects. Accordingly, if possible, it is preferable to reduce the number of times in which the mask process is used because defects are increased in proportion to the number of times in which the mask process is used.

Furthermore, as shown in FIG. 3F, level-differences (i.e., non-planar portions) exist in the completed TFT. As a result, defects during a subsequent rubbing operation can occur.

SUMMARY OF THE INVENTION

One object of the present invention is to provide a method for fabricating an active matrix liquid crystal display having a minimal number of masking steps.

Another object of the present invention is to provide an active matrix liquid display panel with a reduced number of rubber defects.

These and other objects are achieved by providing a method for manufacturing an active matrix liquid crystal display comprising the steps of: forming gate bus lines and gate electrodes on a substrate; forming a gate insulating layer on said gate bus lines; said gate electrodes and said substrate; forming a semiconductor layer on said gate insulating layer; forming an ohmic contact layer on said semiconductor layer; forming source bus lines, source electrodes and drain electrodes on said ohmic contact layer; etching said ohmic contact layer by using said source electrodes and said drain electrodes as an etching mask; forming a passivation layer on said source bus lines, said drain electrodes, said source electrodes, said semiconductor layer and said substrate; selectively removing said passivation layer, said semiconductor layer and said gate insulating layer; forming a second passivation layer over said substrate; selectively removing said passivation layer to form contact holes which expose said drain electrodes; and forming pixel electrodes in contact with said drain electrodes via said contact holes.

These and other objects are also achieved by providing an active matrix liquid crystal display (AMLCD) comprising: a substrate; gate bus lines and gate electrodes formed on said substrate; a gate insulating layer formed on said substrate, said gate bus lines and said gate electrodes; a semiconductor layer formed on said gate insulating layer; an ohmic contact layer formed on said semiconductor layer; source bus lines, source electrodes, and drain electrodes formed on said ohmic contact layer; a first passivation layer covering said semiconductor layer, said source bus lines, said source electrodes and said drain electrodes; a second passivation layer covering said first passivation layer and said substrate, and said first and second passivation layers having contact holes formed therein to expose said drain electrodes and said storage capacitors; and pixel electrodes formed on at least said drain electrodes.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

The present invention will become more fully understood from the detailed description given hereinbelow and the accompanying drawings which are given by way of illustration only, and thus are not limitative of the present invention and wherein . . .

DETAILED DESCRIPTION OF THE PREFERRED EMBODIMENTS

Figure 1:
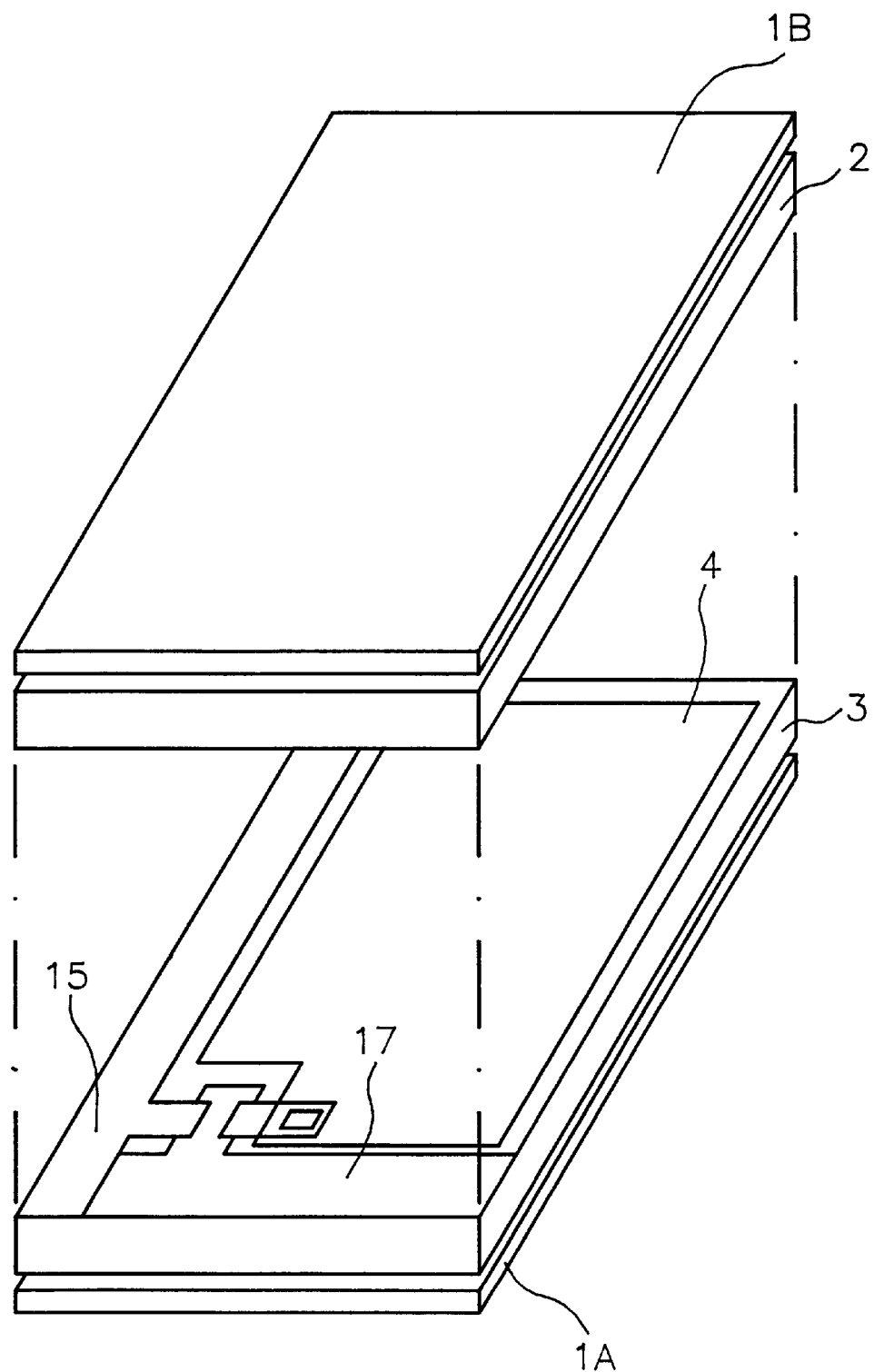
FIG. 1 is a three-dimensional delineation showing a part of a conventional AMLCD.
Figure 2:
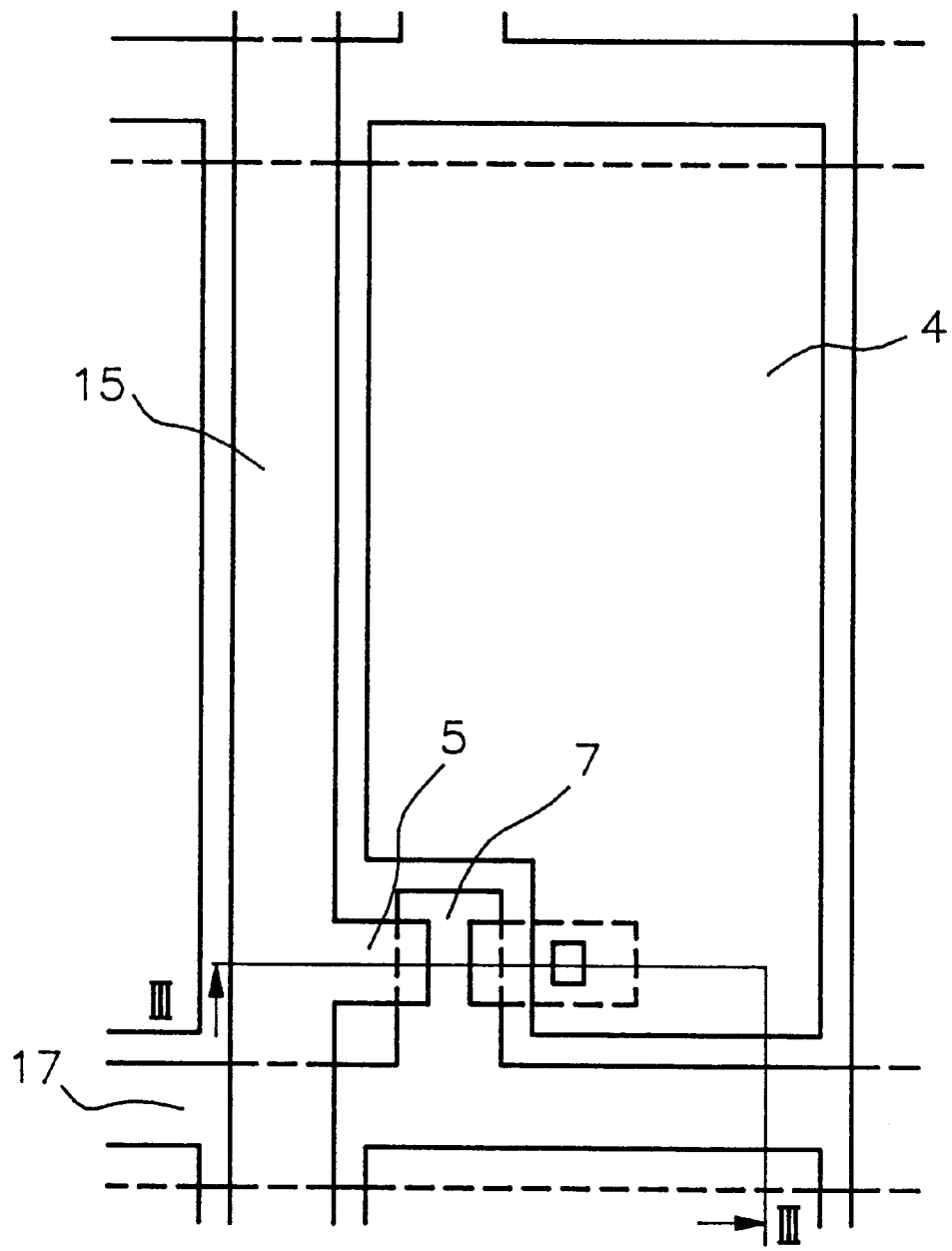
FIG. 2 is a plan view showing a part of the conventional AMLCD.
Figure 3A:
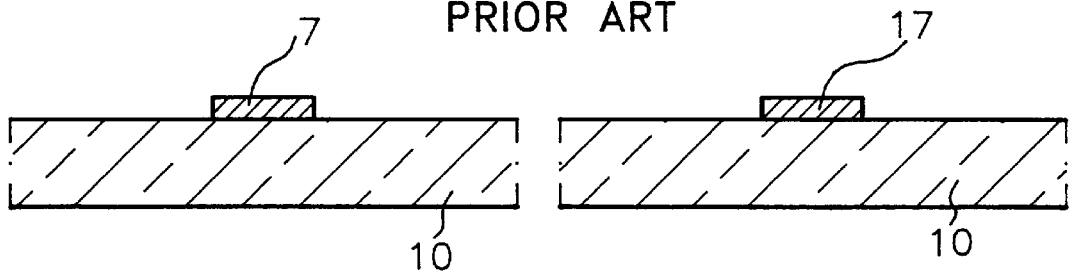
FIGS. 3A to 3F are diagrammatic cross-sectional views showing the manufacturing process of the conventional AMLCD, where views on the left-hand side are taken along III(a)—III(a) of FIG. 2 and views on the right-hand side are taken along III(b)—III(b) of FIG. 2.
Figure 3B:
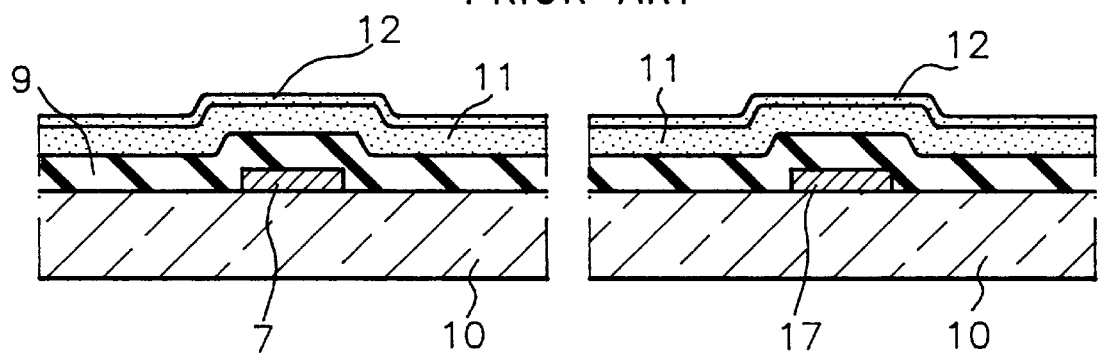
Figure 3C:
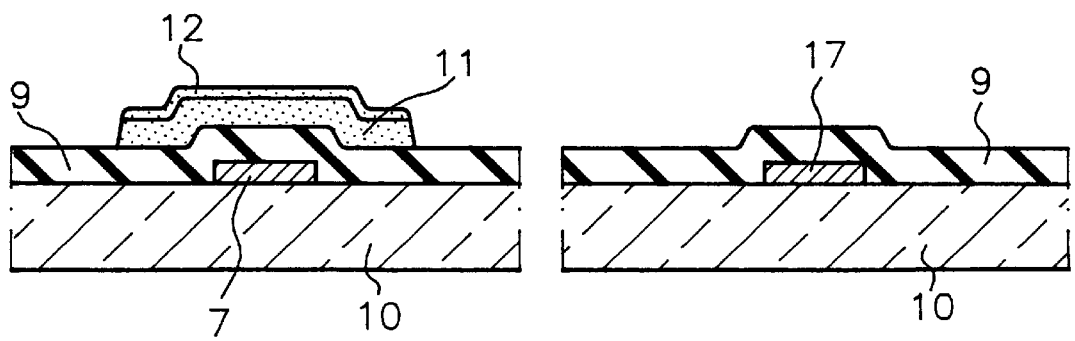
Figure 3D:
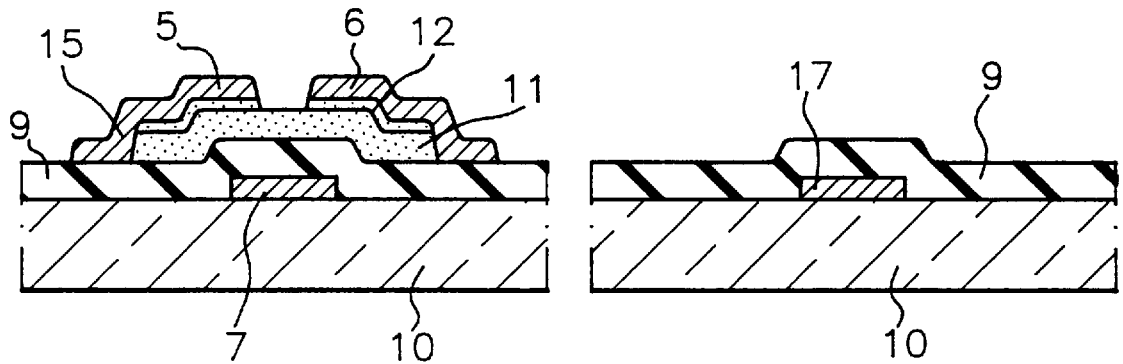
Figure 3E:
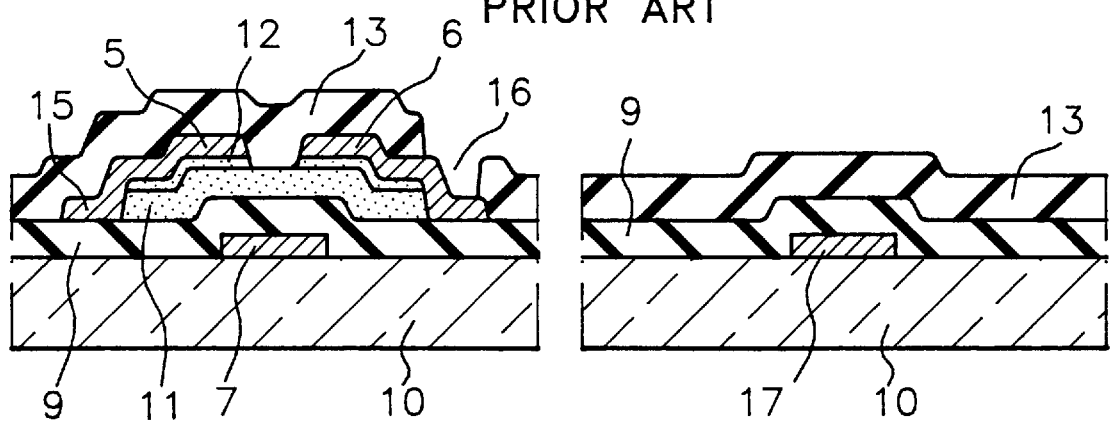
Figure 3F:
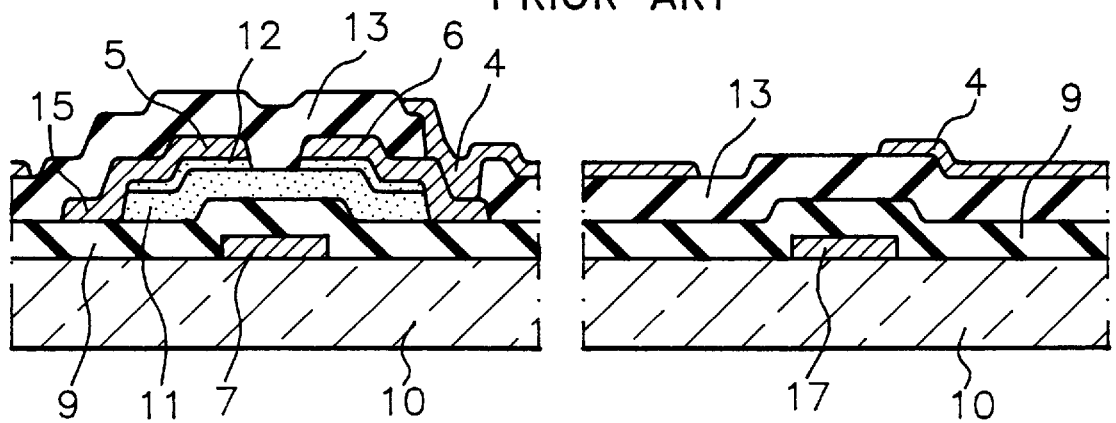
Figure 4:
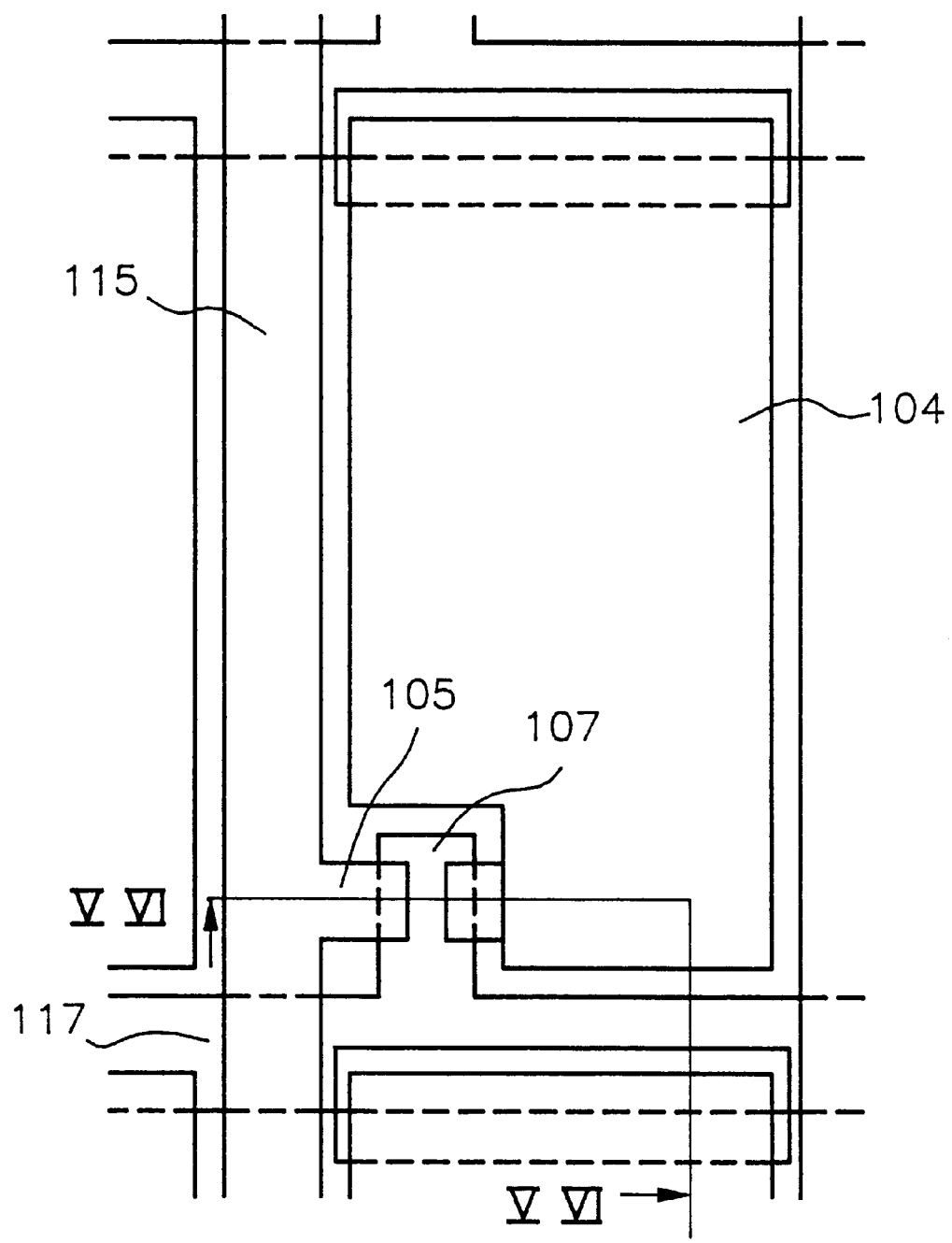
FIG. 4 is a plan view showing a part of an AMLCD according to the present invention.
Figure 5A:
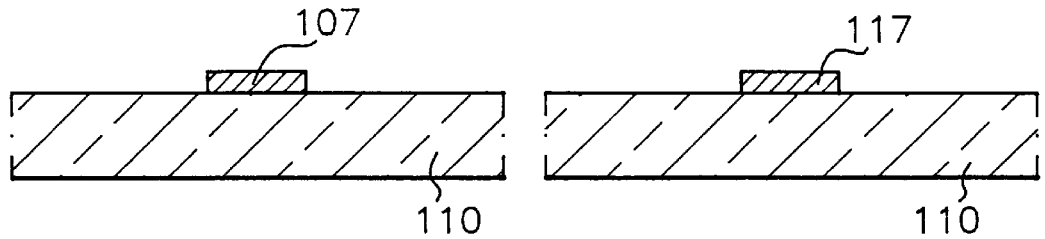
FIGS. 5A to 5I are diagrammatic cross-sectional views showing the manufacturing process according to a first exemplary embodiment of the present invention, where views on the left-hand side are taken along V(a)—V(a) of FIG. 4 and views on the right-hand side are taken along V(b)—V(b) of FIG. 4.

According to a first exemplary embodiment of the present invention, beginning as shown in FIG. 5A, a first metal layer, e.g., Cr, is deposited on a transparent glass substrate 110. A photo-resist is coated on the first metal layer and the photo-resist is developed into a desired pattern by using a mask. The first metal layer is etched by a wet-etching method along the developed pattern, and thereby a gate bus line 117 and a gate electrode 107 (which branches out from the gate bus line 117) are formed (FIG. 5A).

Figure 5B:
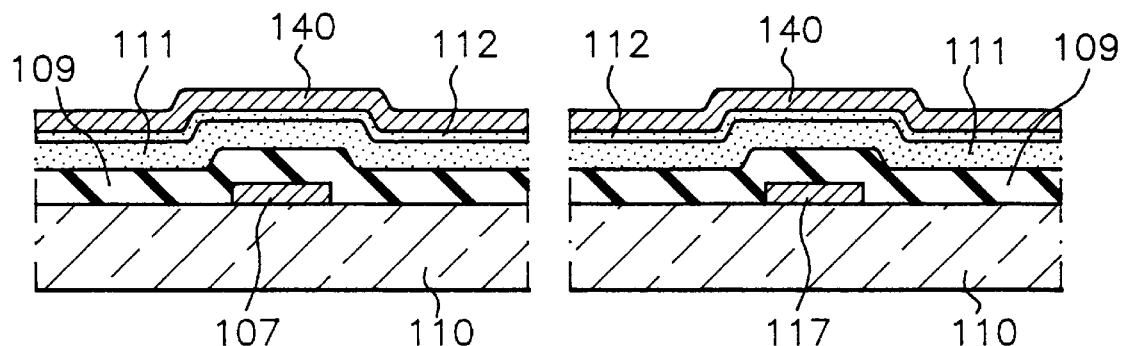
Figure 5C:
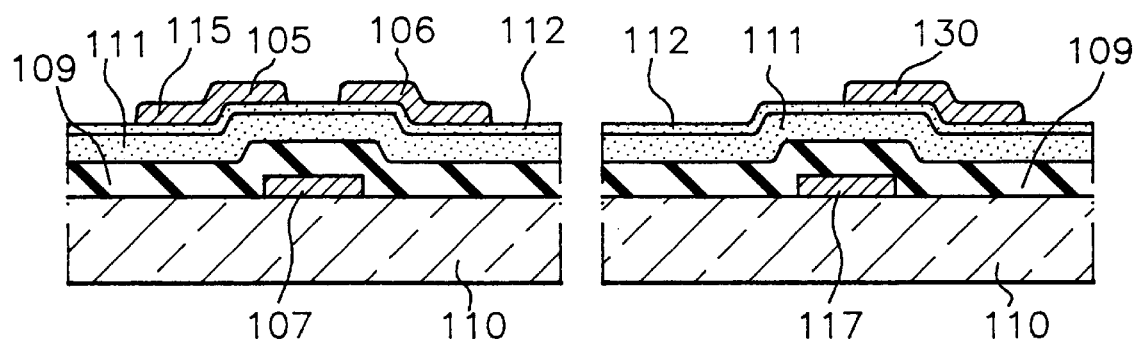

Afterward, a SiNx film (from which a gate insulating layer 109 is formed later), an a-Si film (from which a semiconductor layer 111 is formed later), an n+ a-Si film (from which an ohmic contact layer 117 is formed later) and a CR layer (from which a second metal layer 140 is formed later) are sequentially deposited (FIG. 5B). Therefore, a photo-resist is coated on the second metal layer 140 and the photo-resist is developed into a desired pattern by using a mask. The second metal layer 140 is etched by a wet-etching method along the developed pattern, and thereby the source bus line 115 (functioning as a signal line), the source electrode 105 (which branches out from the source bus line 115), the drain electrode 106 (functioning as an output electrode) and a storage capacitor 130 are formed. The storage capacitor 130 overlaps a part of the gate bus line (FIG. 5C).

Figure 5D:
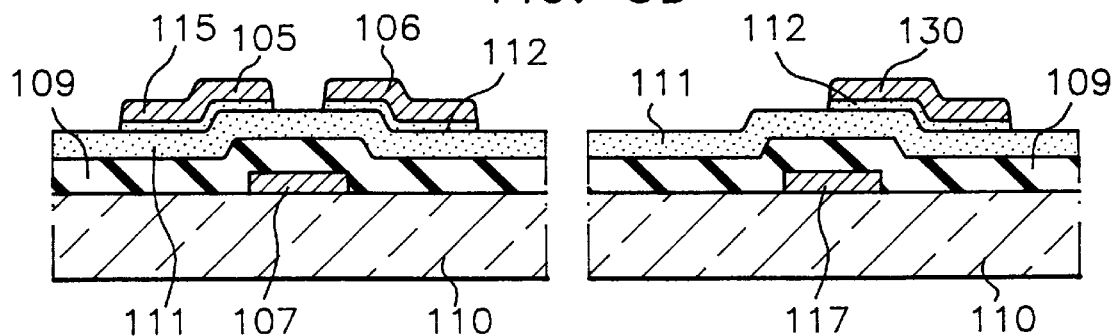

Then, the $n^+$ a-Si film is etched by using the source bus line 115, the source electrode 105, the drain electrode 106 and the storage capacitor 130 as etching masks, and thereby an ohmic contact layer 112 is formed (FIG. 5D).

Figure 5E:
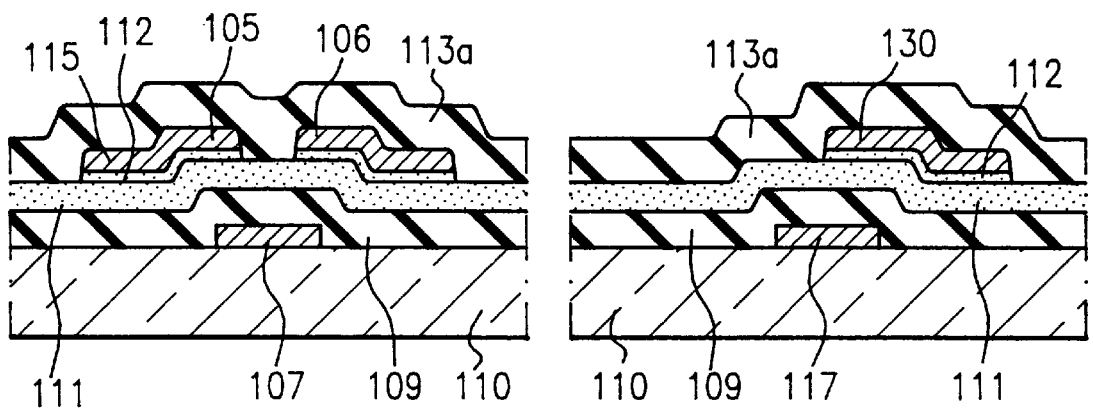

A first passivation layer 113a, e.g., made of an inorganic insulating material, is deposited on the semiconductor layer 111, the edges of the ohmic contact layer 112, the source bus 115, the source electrode 105, the drain electrode 106 and the storage capacitor 130 (FIG. 5E).

Figure 5F:
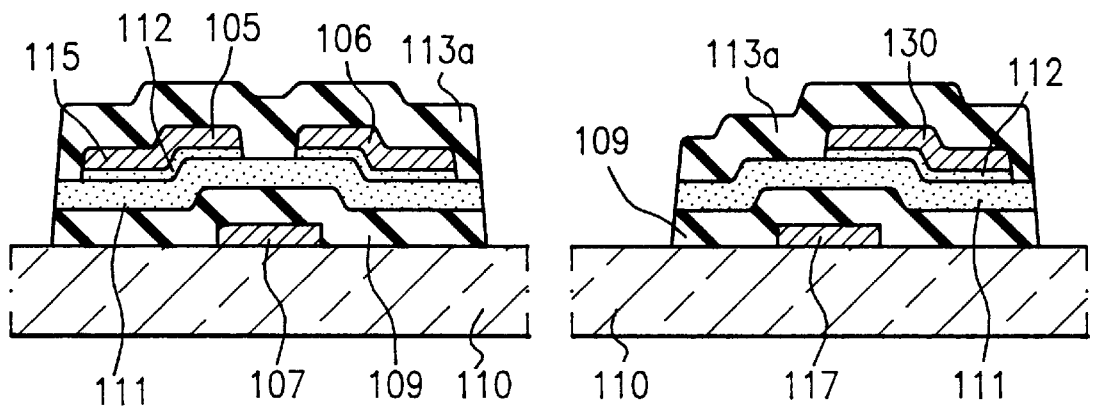

A photo-resist is coated on the first passivation layer 113a, and the photo-resist is developed by using a mask so that the photo-resist covers a part of the storage capacitor 130, the drain electrode 106, a part of the a-Si film, the source bus line 115 and the source electrode 105. The first passivation layer 113a, the a-Si film 111 and the SiNx film 109 are simultaneously etched by a dry-etching method along the developed pattern of the photo-resist, and thereby a semiconductor layer 111 and a gate insulating layer 109 are formed (FIG. 5F).

Figure 5G:
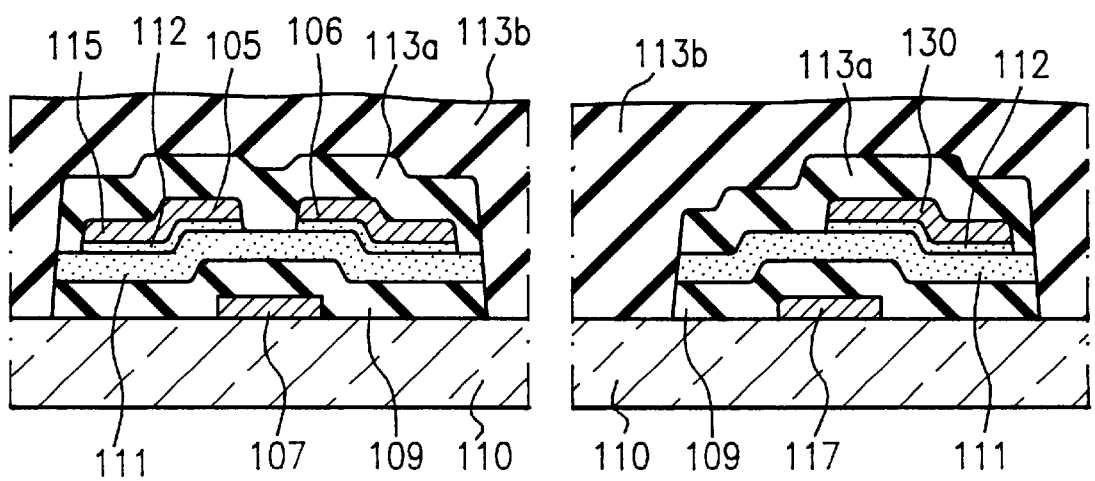

Afterward, a second passivation layer 113b is formed by depositing, e.g., an organic material, on the substrate 110, the edges of the gate insulating layer 109, the edges of the semiconductor layer 111 and the first passivation layer 113a (FIG. 5G).

In the case that the second passivation layer 113b is formed with an organic material as described above, level-difference is not formed on the surface of the organic insulating layer when the organic insulating layer is deposited on any portions having level-difference such as the source bus line. Therefore, the pixel electrode formed on the organic insulating layer can be formed evenly, and defects in rubbing at the portions having level-difference can be reduced.

As a result thereof, defects in rubbing at the step-coverage of the source bus line do not occur although the pixel electrode is formed to overlap the source bus line. Therefore, the aperture ratio of the liquid crystal display can be improved.

Figure 5H:
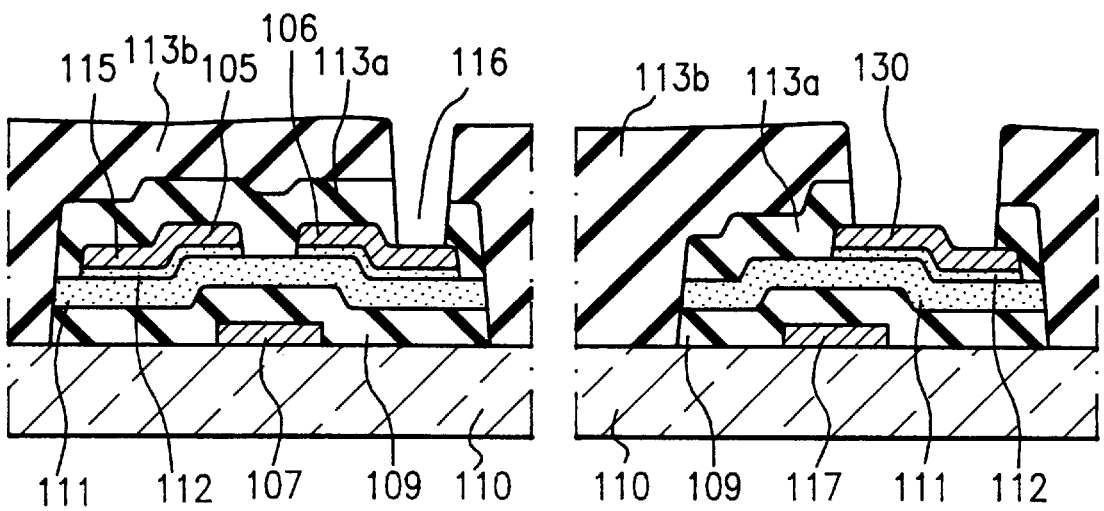

Then, a photo-resist is coated on the second passivation layer 113b and the photo-resist is developed into a desired pattern by using a mask. The second passivation layer 113b and the first passivation layer 113a are etched along the developed pattern of the photo-resist, and thereby a contact hole 116 is formed through to the drain electrode 106 and the storage capacitor 130 (FIG. 5H).

Figure 5I:
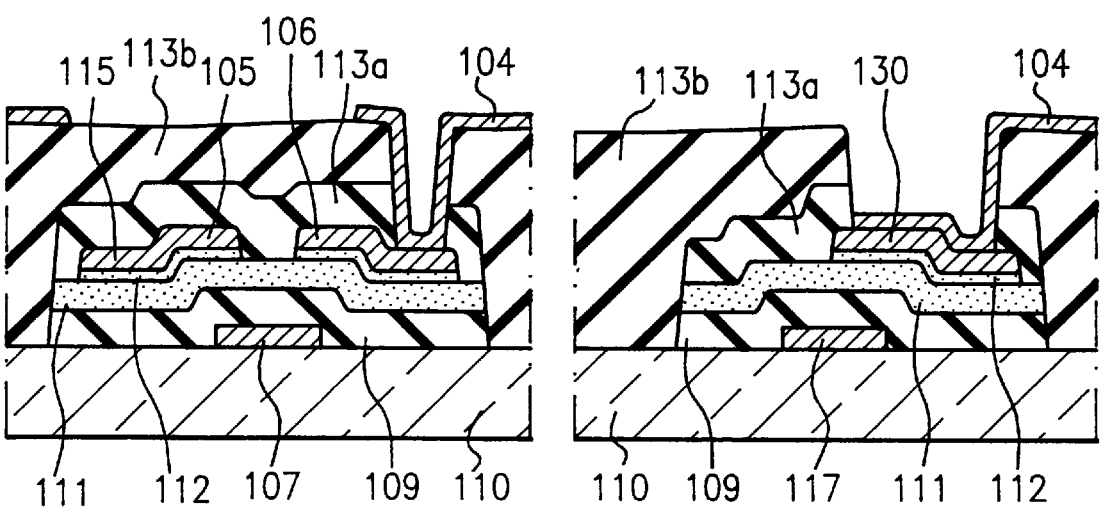

Thereafter, an ITO layer, a transparent conductive layer, is deposited by sputtering on the first and second passivation layers 113a and 113b, drain electrode 106 and the storage capacitor 130. A photo-resist is coated on the ITO layer and the photo-resist is developed into a desired pattern by using a mask. The ITO layer is etched along the developed pattern of the photo-resist, and thereby a pixel electrode 104 is formed to be electrically connected with a part of the storage capacitor 130 and a part of the drain electrode 106 (FIG. 5I).

The manufacturing steps of the second exemplary embodiment of the present invention are the same as the steps of the first exemplary embodiment 1 depicted in FIGS. 5A to 5E.

Figure 6A:
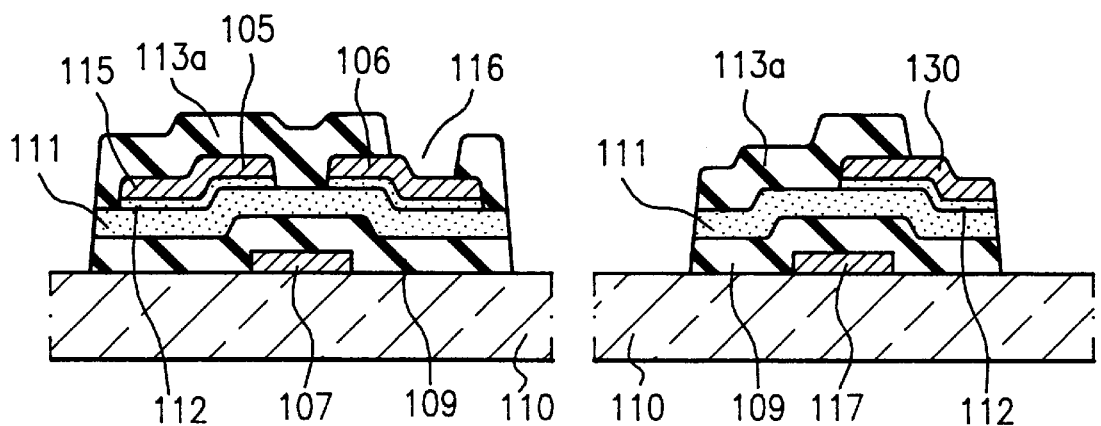
FIGS. 6A to 6B are diagrammatic cross-sectional views showing the manufacturing process according to a second exemplary embodiment of the present invention, where views on the left-hand side are taken along VI(a)—VI(a) of FIG. 4 and views on the right-hand side are taken along VI(b)—VI(b) of FIG. 4.

In FIG. 6A, a photo-resist is coated on the first passivation layer 113a and the photo-resist is developed into a desired pattern by using a mask. The first passivation layer 113a is etched along the developed pattern of the photo-resist, and thereby a contact hole 116 is formed through to the drain electrode 106 and a storage capacitor 130 (FIG. 6A).

Figure 6B:
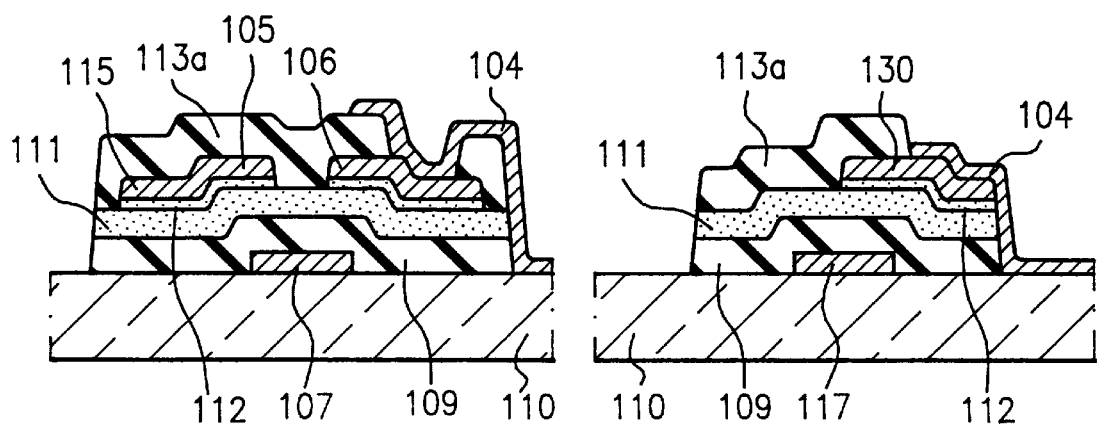

Then, an ITO layer, i.e., a transparent conductive layer, is deposited on the substrate 110, the edges of the gate insulating layer 109, the edges of the semiconductor layer 111, an edge of the ohmic contact layer 112, the passivation layer 113a and the drain electrode 106. A photo-resist is coated on the ITO layer and the photo-resist is developed into a desired pattern by using a mask. The ITO layer is etched along the developed pattern of the photo-resist, and thereby a pixel electrode 104 is formed to be electrically connected with a part of the storage capacitance electrode 130 and a part of the drain electrode 106 (FIG. 6B).

According to the first and second exemplary embodiments of the present invention, the number of times in which the mask process is used can be reduced in the present invention, e.g., from five times in the conventional FIGS. 3A–3F down to four times in the second exemplary embodiment of the present invention. As a result of this, the defects arising from the mask process can be reduced, and also the manufacturing yield can be improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing an active matrix liquid crystal display comprising the steps of:

forming gate bus lines and gate electrodes on a substrate;
   forming a gate insulating layer on said gate bus lines, said gate electrodes and said substrate;
   forming a semiconductor layer on said gate insulating layer;
   forming an ohmic contact layer on said semiconductor layer;
   forming source bus lines, source electrodes and drain electrodes on said ohmic contact layer;
   etching said ohmic contact layer by using said source electrodes and said drain electrodes as an etching mask;
   forming a first passivation layer on said source bus lines, said drain electrodes, said source electrodes and said semiconductor layer;
   selectively removing said first passivation layer, said semiconductor layer and said gate insulating layer;
   forming a second passivation layer over said substrate;
   selectively removing said first passivation layer and said second passivation layer to form contact holes which expose said drain electrodes; and
   forming pixel electrodes in contact with said drain electrodes via said contact holes.

2. The method as in claim 1, wherein said steps of forming said gate insulating layer, forming said semiconductor layer, forming said ohmic contact layer, and forming said source bus lines, said source electrodes and said drain electrodes comprise:

sequentially depositing a material for said gate insulating layer, a material for said semiconductor layer, a material for said ohmic contact layer, and a material for said source bus lines, said source electrodes and said drain electrodes.

3. The method as in claim 2, wherein said step of forming said source bus lines, said source electrodes and said drain electrodes comprises:

forming storage capacitor electrodes of storage capacitors on said ohmic contact layer.

4. The method as in claim 1, wherein said step of forming said second passivation layer forms said second passivation layer from an organic material.

5. The method as in claim 1, wherein said forming pixel electrodes step forms said pixel electrodes on said second passivation layer.

6. The method as in claim 5, wherein said forming a second passivation layer step forms a substantially planar passivation layer as said second passivation layer.

7. The method as in claim 6, wherein said step of forming said second passivation layer forms said second passivation layer from an organic material.

8. The method as in claim 1, wherein said forming a second passivation layer step forms a substantially planar passivation layer as said second passivation layer.

9. The method as in claim 8, wherein said step of forming said second passivation layer forms said second passivation layer from an organic material.

10. An active matrix liquid crystal display (AMCLD) comprising:

a substrate;
   gate bus lines and gate electrodes formed on said substrate;
   a gate insulating layer formed on said substrate, said gate bus lines and said gate electrodes;
   a semiconductor layer formed on said gate insulating layer;
   an ohmic contact layer formed on said semiconductor layer;
   source bus lines, source electrodes, and drain electrodes formed on said ohmic contact layer;
   a first passivation layer covering said semiconductor layer, said source bus lines, said source electrodes and said drain electrodes;

a second passivation layer covering said first passivation layer, said substrate and sidewalls of said first passivation layer, said semiconductor layer and said gate insulating layer, and said first and second passivation layers having contact holes formed therein to expose said drain electrodes; and pixel electrodes formed on at least said drain electrodes via said contact holes.

11. The AMLCD as in claim 10, further comprising:

storage electrodes of storage capacitors formed on said ohmic contact layer; and wherein said pixel electrodes are formed on said storage electrodes.

12. The AMLCD as in claim 10, wherein said second passivation layer is an organic material.

13. The AMLCD as in claim 10, wherein said pixel electrodes are also formed on said second passivation layer.

14. The AMLCD as in claim 13, wherein said second passivation layer is substantially planar.

15. The AMLCD as in claim 14, wherein said second passivation layer is an organic material.

16. The AMLCD as in claim 10, wherein said second passivation layer is substantially planar.

17. The AMLCD as in claim 16, wherein said second passivation layer is an organic material.

18. The AMLCD as in claim 10, wherein said sidewalls of said first passivation layer, said semiconductor layer and said gate insulating layer are aligned.

* * * * *